(12) United States Patent
Gee et al.

(10) Patent No.: US 6,869,330 B2
(45) Date of Patent: Mar. 22, 2005

(54) METHOD FOR FABRICATING A PHOTONIC CRYSTAL

(75) Inventors: James M. Gee, Albuquerque, NM (US); Shawn-Yu Lin, Albuquerque, NM (US); James G. Fleming, Albuquerque, NM (US); James B. Moreno, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 189 days.

(21) Appl. No.: 10/350,711

(22) Filed: Jan. 23, 2003

(65) Prior Publication Data

US 2003/0132705 A1 Jul. 17, 2003

Related U.S. Application Data

(62) Division of application No. 09/940,962, filed on Aug. 27, 2001, now Pat. No. 6,611,085.

(51) Int. Cl.[7] .................................................. H01J 9/00
(52) U.S. Cl. ...................................................... 445/50
(58) Field of Search ...................... 445/50, 51; 313/271, 313/315, 272, 273, 574, 316; 438/691, 692; 359/344, 240

(56) References Cited

U.S. PATENT DOCUMENTS

| | | | |
|---|---|---|---|
| 5,406,573 A | 4/1995 | Ozbay et al. |
| 5,440,421 A | 8/1995 | Fan et al. |
| 5,814,840 A | 9/1998 | Woodall et al. |
| 5,990,850 A | 11/1999 | Brown et al. |
| 5,997,795 A | 12/1999 | Danforth et al. |
| 5,998,298 A | 12/1999 | Fleming et al. |
| 6,134,043 A | 10/2000 | Johnson et al. |
| 6,188,819 B1 | 2/2001 | Kozaka et al. |
| 6,274,293 B1 | 8/2001 | Gupta et al. |
| 6,358,854 B1 | 3/2002 | Fleming et al. |
| 6,414,332 B1 | 7/2002 | Fleming et al. |

FOREIGN PATENT DOCUMENTS

JP    2000-267585 A    9/2000

OTHER PUBLICATIONS

Lin, et al., "A Three–Dimensional Photonic Crystal Operating at Infrared Wavelengths," Nature, vol. 394, Jul. 16, 1998, 251–253.
Sigalas, et al., "Metallic Photonic Band–Gap Materials," PRB 52 16, Oct. 15, 1995, 11 744–11 751.
Lin, et al., "Enhancement and Suppression of Thermal Emission by a Three–Dimensional Photonic Crystal," Rapid Communications, PRB 62 4, Jul. 15, 2000, R2243–R2246.
Bergman, et al., "Filament Lamps," GE R&D Ctr, 98CRD027, Feb. 1998, 1–30.
Smay et al., "Robocasting of Photonic Band Gap Structures," presented at the Twelfth Solid Freeform Fabrication Symposium, Univ. of Texas, Austin, Tx. Aug. 6–8, 2001.

*Primary Examiner*—Joseph Williams
(74) *Attorney, Agent, or Firm*—Kevin W. Bieg

(57) ABSTRACT

A photonically engineered incandescence is disclosed. The emitter materials and photonic crystal structure can be chosen to modify or suppress thermal radiation above a cutoff wavelength, causing the emitter to selectively emit in the visible and near-infrared portions of the spectrum. An efficient incandescent lamp is enabled thereby. A method for fabricating a three-dimensional photonic crystal of a structural material, suitable for the incandescent emitter, is also disclosed.

20 Claims, 9 Drawing Sheets

METHOD FOR FABRICATING A PHOTONIC CRYSTAL

CROSS REFERENCE TO RELATED APPLICATIONS

This is a divisional of application Ser. No. 09/940,962, filed Aug. 27, 2001 and since issued as U.S. Pat. No. 6,611,085.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

The present invention relates to incandescent lamps, and more particularly to incandescent lamps made from photonically engineered thermal emitters.

Incandescent lamps offer very high quality lighting, are inexpensive, and are the most popular lighting technology for residential use. They are also, unfortunately, the least efficient (energy to useful light) lighting technology used commercially today. An excellent overview of incandescent lamp technology is given in Bergman et al., *Filament Lamps*, GE Research and Development Center, Report 98CRD027, February 1998.

The lighting industry commonly uses the term luminous efficacy to describe the efficiency of a lamp. Luminous efficacy is frequently defined as the luminous flux divided by the total radiant power in units of lumens/Watt. The luminous flux has units of lumens, and is the radiant flux weighted by the human eye response. A better description for the efficiency of a lamp is to divide the luminous flux by the total input power to the lighting source, so that the electrical performance can be factored into the comparison of lighting technologies. This disclosure will use the latter definition for luminous efficacy, since some lighting approaches have inherently less efficiency in converting input electrical power into radiant power.

The luminous efficacy of a 60 W incandescent lamp using a tungsten filament is only about 15 lumens/Watt. The luminous efficacy of the incandescent lamp is low because much of the light (around 90%) is emitted by the tungsten filament in the non-visible infrared (wavelengths longer than 760 nm) portion of the spectrum. Fluorescent lamps are much more efficient than incandescent lamps, and have luminous efficacies between 75 and 100 lumens/Watt. By comparison, the theoretical maximum luminous efficacy for high-quality white lighting using a broad spectral source is around 200 lumens/Watt.

An incandescent lamp works by heating up a tungsten filament to a sufficiently high temperature (typically around 2800° K) that it radiates in the visible portion of the electromagnetic spectrum (roughly 380 to 760 nm). Such high-temperature bodies are commonly referred to as "emitters" or "radiators". The radiation from a high-temperature emitter is described by the theory of blackbodies. An ideal blackbody emits the theoretically maximum radiation. Real emitters do not radiate as well as an ideal blackbody. The emissivity is the ratio of the radiation from a real emitter to the radiation of an ideal blackbody, and is unitless with a value between 0 and 1.

The luminous efficacy of the incandescent lamp can be improved by modifying the emissivity of the emitter. The optimum emitter for lighting purposes would have an emissivity of unity in the visible portion of the spectrum and an emissivity of zero in the non-visible portions of the spectrum. Such an emitter would emit all the light in the useful visible portion of the spectrum and no light in the non-useful non-visible portion of the spectrum. A 2800° K emitter with such an optimized selective emission would have a luminous efficacy approaching 200 lumens/Watt, or over 10× improvement compared to current incandescent lamps and 2× improvement compared to current fluorescent lamps.

There remains a need for a high-temperature emitter that selectively emits radiation in the visible portion of the spectrum, thereby enabling an incandescent lamp having improved luminous efficacy.

SUMMARY OF THE INVENTION

The present invention provides a photonically engineered incandescent emitter, comprising a photonic crystal having a characteristic lattice constant and comprising an emitter material having a first dielectric constant and at least one other lattice material having at least one other dielectric constant and wherein the characteristic lattice constant, the emitter material, and the at least one other lattice material are chosen so as to create a photonic bandgap that suppresses or modifies thermal emission above a desired cutoff wavelength. The emitter material can comprise a refractory non-metal or a refractory metal, such as tungsten. The photonically engineered incandescent emitter can thereby be tailored to selectively emit thermal radiation in the visible and near-infrared portions of the spectrum, enabling a more efficient incandescent lamp.

The present invention further provides a method for fabricating the photonically engineered structure, suitable for the incandescent emitter, comprising forming a lattice structure mold of a sacrificial material on a substrate; depositing a structural material into the lattice structure mold; and removing the sacrificial material from the lattice structure mold. Silicon integrated circuit technology is particularly well suited to forming the lattice structure mold to enable the formation of photonic crystals of refractory materials with lattice constants on the order of the wavelength of visible light.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 4 shows a cross-sectional scanning electron micrograph of a four-layer tungsten photonic crystal built on a (001) oriented silicon substrate.

DETAILED DESCRIPTION OF THE INVENTION

The present invention comprises a photonically engineered incandescent emitter that is more efficient than conventional incandescent lamps and a method for making the same. The more efficient incandescent emitter of the present invention is enabled by improving the emission selectivity of a high-temperature emitter using photonically engineered structures. Photonically engineered structures consist of materials with a periodic variation on the order of the wavelength of light. The periodic variation changes the allowed optical modes in the medium, leading to many varied and useful properties. Some photonic structures completely eliminate optical modes in all directions for a specific band of wavelengths. These structures are said to exhibit a three-dimensional (3D) photonic bandgap. A description of photonic crystals and their properties is given by Joannopoulos et al., *Photonic Crystals: Molding the Flow of Light* (1995).

The thermal emission spectrum and, therefore, the emissivity can be altered by suitable modification of the properties of photonic structures. The use of photonic structures for the control of emission of thermal radiation from an object is disclosed in copending U.S. patent application Ser. No. 09/441,221 to Lin and Fleming, which is incorporated herein by reference. Modification of the thermal radiation from a photonic structure in the infrared portion of the spectrum has been described by Lin et al. in "Enhancement and suppression of thermal emission by a three-dimensional photonic crystal," Phys. Rev B62, R2243 (2000). Lin et al. fabricated a 3D "Lincoln-Log" type silicon photonic crystal with air as the second dielectric. The silicon photonic crystal had a lattice constant of 4.2 $\mu$m and a large photonic bandgap covering the infrared wavelength range from $\lambda$=9–15 $\mu$m. When heated to 410° C., the silicon photonic crystal exhibited significantly reduced emissivity between 10 and 16 $\mu$m, indicative of the 3D photonic band gap.

Figure 1:
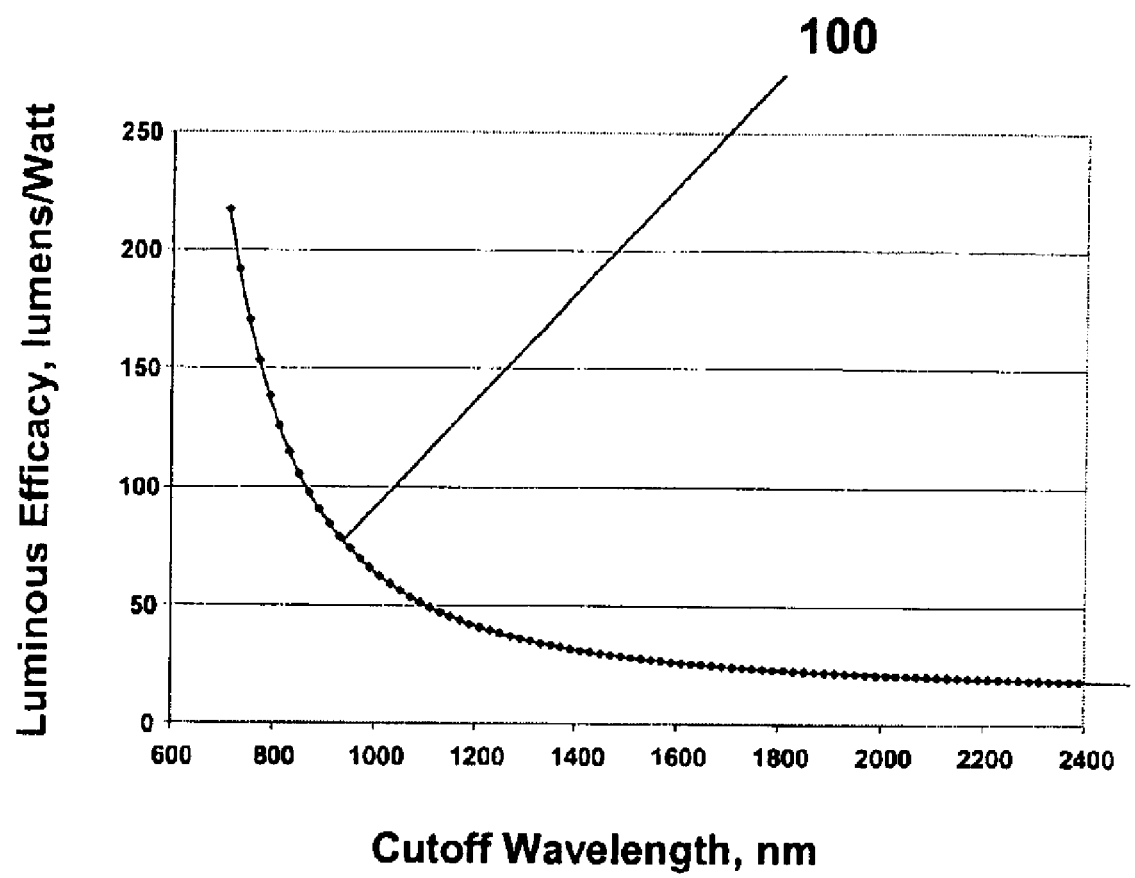
FIG. 1 shows the estimated luminous efficacy of an optimized incandescent source where the emissivity is unity above and zero below a cutoff wavelength.

FIG. 1 shows the luminous efficacy 100 for an optimized incandescent source having an emissivity of unity above and zero below a cutoff wavelength. The luminous efficacy is maximized by moving the cutoff wavelength as close as possible to the long-wavelength edge of visible light (i.e., 760 nm). Luminous efficacies approach 200 lumens/Watt with such an optimized emitter. Thus, for incandescent lighting applications in the visible portion of the spectrum, the photonic bandgap of the photonic crystal must be closer to the long-wavelength edge of visible light than was obtained with the silicon photonic crystal of Lin et al.

To move the photonic bandgap closer to the long-wavelength edge of visible light, the photonic crystal can have smaller dimensions and use materials that have greater dielectric contrast and can tolerate high temperatures (e.g., 2800° K). As described by Bergman et al., the most common material used for incandescent lamp filaments are tungsten-based materials. As a metal, tungsten also offers the advantage of a large refractive index when used in a photonic crystal. A large difference in the refractive index enhances the effect of the periodic variation of the refractive index on the optical modes in the photonic crystal, thereby producing a photonic crystal with a large photonic bandgap wherein the emissivity is reduced.

Photonically Engineered Emitter Structures

The present invention discloses a 2D or 3D photonic crystal that selectively emits at visible and near-infrared wavelengths. Various types of photonic crystal structures that exhibit a 2D or 3D photonic bandgap known to those in the art are suitable for the present invention. Some examples of photonic crystal structures and the fabrication thereof are disclosed in U.S. patent application Ser. No. 09/296,702 to Fleming and Lin, which is incorporated herein by reference.

Figure 2:
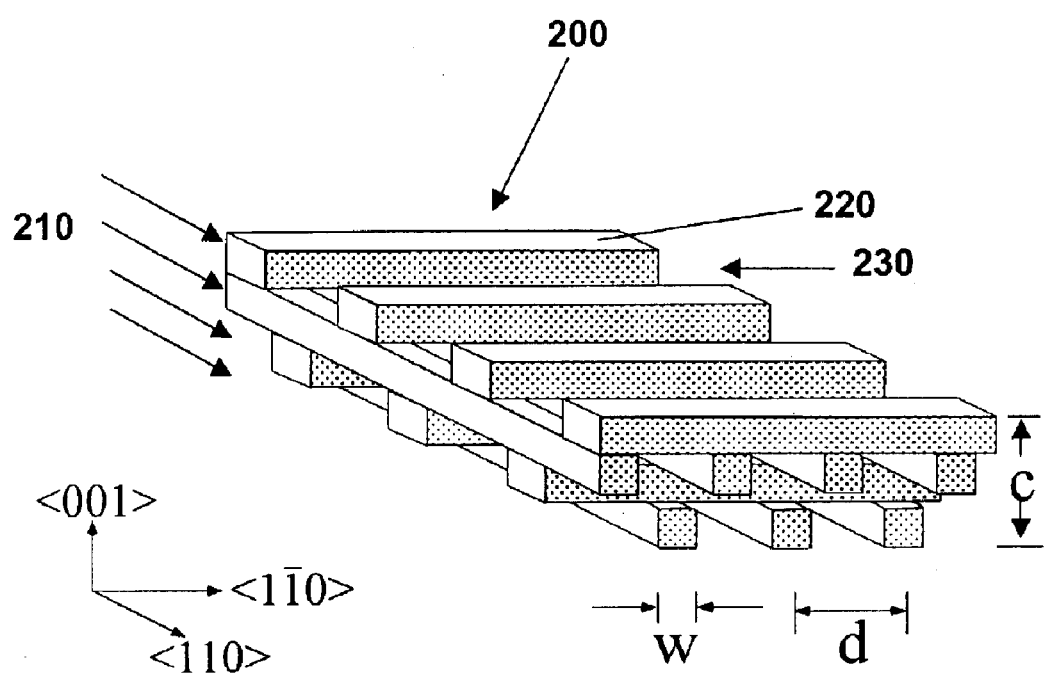
FIG. 2 shows a schematic illustration of a three-dimensional (3D) "Lincoln-Log" type photonic crystal structure.

A common type of photonic crystal exhibiting a 3D photonic bandgap that will be used as an illustrative example in the present disclosure is the Lincoln-Log type of photonic crystal structure 200 shown schematically in FIG. 2. The 3D Lincoln-Log type structure comprises alternating layers 210, each layer 210 further comprising an evenly spaced row of parallel "logs" or rods 220 of material with a first dielectric constant. The spaces between the rods 220 are filled by a material 230 having a second dielectric constant. For simplicity as well as for high dielectric contrast, material 230 is often air. For a four-layer photonic crystal 200, the one-dimensional rods 220 have a stacking sequence that repeats itself every four layers with a repeat distance of c. Within each layer 210, the axes of the rods 220 are parallel to each other with a pitch of d. Alternate layers 210 are rotated by 90 degrees relative to the previous layer. Between each layer 210, the rods 220 are shifted relative to each other by 0.5 d. The resulting structure has a face-centered-tetragonal lattice symmetry of which the diamond structure is a subset. For the special case of c/d=1.414, the crystal 200 can be derived from a face-centered-cubic unit cell with a basis of two rods.

Fabrication of the Photonic Crystal

Photonic crystal structures exhibiting 2D or 3D photonic bandgaps suitable for the present invention can be fabricated by various methods known to those skilled in the art. The vertical topology of the 3D photonic crystal structure can be built by repetitive deposition and etching of multiple dielectric films in a layer-by-layer method. One layer-by-layer method for fabricating the photonic crystal is to build up the structure directly with the structural material, as was done for the silicon photonic crystal of Lin et al., described above. Alternatively, the fabrication process can comprise forming a lattice structure mold for the structural material in a sacrificial material, selective deposition of the structural material into the lattice structure mold, and finally removing the sacrificial material from the backfilled mold to leave a photonic crystal of the structural material. The latter method may have advantages for structural materials that can otherwise build up large residual stresses during a direct layer-by-layer fabrication process. This fabrication process can be used to form photonic crystals of a wide variety of structural materials that can be deposited by a conformal process, including metals, metal alloys, and semiconductors.

For illustrative purposes, described below and illustrated in FIGS. 3a–3i is a layer-by-layer fabrication sequence for a 3D Lincoln Log tungsten photonic crystal suitable for the incandescent emitter of the present invention. The tungsten photonic crystal described herein has a pitch between adjacent rods of d=4.2 $\mu$m, a rod width of w=1.2 $\mu$m, and a layer thickness of 1.6 $\mu$m. Photonic crystals of other refractory metals and non-metals, such as tungsten alloys, silicon carbide, carbon, and titania, are also suitable for the photonically engineered incandescent emitter of present invention.

The lattice structure mold can be formed by sequential deposition of a cavity-forming structural material, such as polysilicon, in alternating patterned layers of a sacrificial mold material, such as silica ($SiO_2$). The basic layer-by-layer polysilicon in silica fabrication sequence is described by Lin et al. in *Nature* 394, 251 (1998) and in the copending U.S. patent application Ser. No. 09/296,702 to Fleming and Lin. The layer-by-layer fabrication method disclosed by Fleming and Lin enables layered material composition with precise thickness, planarity, and alignment control.

Figure 3A:
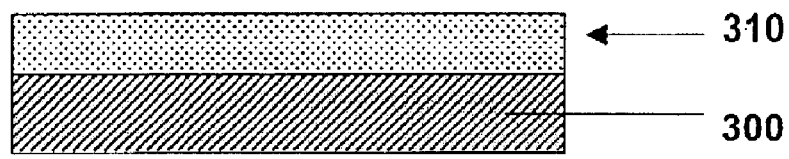
FIG. 3 illustrates a fabrication sequence for a four-layer Lincoln-Log type tungsten photonic crystal.

In FIG. 3a, a first layer 310 comprised of the sacrificial mold material, e.g., silica, is deposited onto a silicon substrate 300. The thickness of silica layer 310 is greater than the desired thickness of the first structured layer 340 of the photonic lattice, whose thickness is typically in the range 0.02–10 µm, depending on the cutoff wavelength of interest. For the 3D tungsten photonic crystal described herein, the thickness of the structured layer 340 can be 1.6 µm, and the initial thickness of silica layer 310 can be approximately 2.0 µm.

Figure 3B:
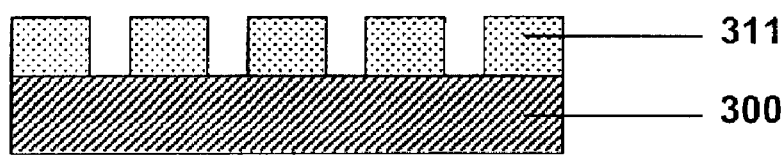

FIG. 3b shows the first silica layer 310 patterned to form a plurality of evenly spaced and parallel spacer bars 311 with approximately rectangular cross-section. Such patterning can be accomplished using a photolithographic etch mask (not shown) over silica layer 310 with a plurality of openings in the etch mask at the locations where the material in layer 310 between the spacer bars 311 is to be removed. An anisotropic etching process can then be used (e.g., reactive ion etching directed normal to the surface), resulting in bars 311 having approximately rectangular cross-section. The etching step is preferably performed to etch completely down through layer 310 to the substrate 300. The etch mask can then be stripped, resulting in the structure of FIG. 3b. In the present example, the pitch between adjacent spacer bars 311 can be 4.2 µm and the width of the spacer bars can be 3.0 µm.

Figure 3C:
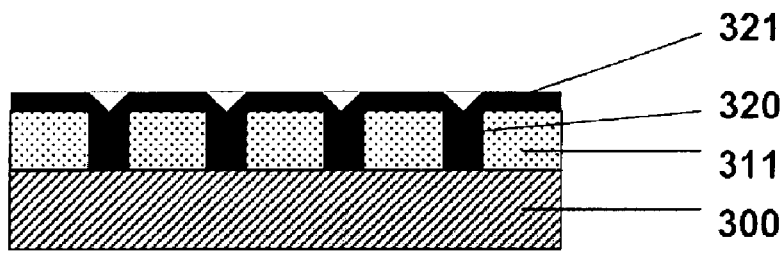

In FIG. 3c, polysilicon 320 can be deposited by chemical vapor deposition to fill in the regions between the silica spacer bars 311. Again, the polysilicon thickness can be greater than the desired final thickness of the first structured layer 340. Depositing the polysilicon 320 generally leads to a complex and non-planar surface 321. Such a rough and uneven surface could result in a poor quality photonic crystal, due to scattering and uncontrolled reflections at the growth surface. Therefore, chemical-mechanical-polishing (CMP) of the growth surface is performed to planarize the growth surface prior to deposition of subsequent structural layers. CMP of the general type used in the present invention is disclosed in U.S. Pat. No. 5,998,298 to Fleming et al., which is incorporated herein by reference.

Figure 3D:
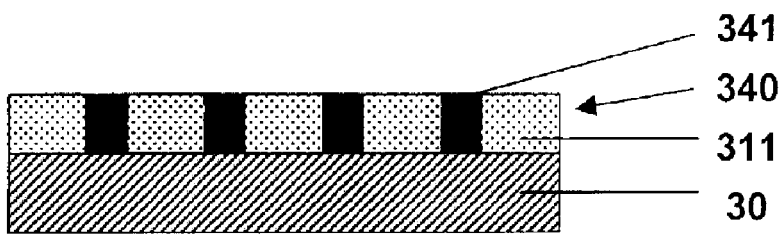

As shown in FIG. 3d, a first structured layer 340 comprising a planar pattern of silica spacer bars 311 and polysilicon rods 341 is thereby produced. The polysilicon rods 341 are elongate, roughly rectangular in cross section, and can be 1.2 µm wide and 1.6 µm thick.

Figure 3E:
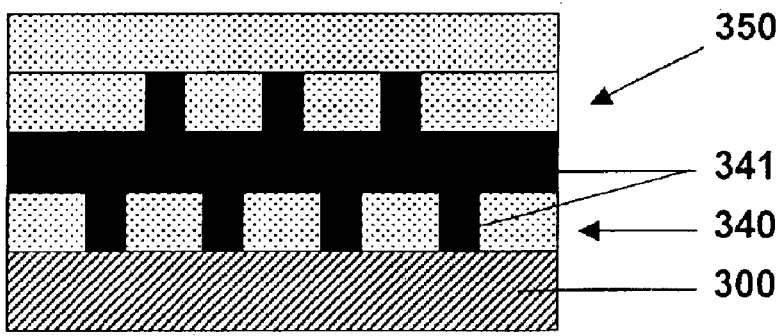

As shown in FIG. 3e, repeating the same basic set of growth and processing steps, multiple structured layers 340 can be grown on top of the substrate 300 to form the desired photonic lattice structure 350 with polysilicon. To form the Lincoln-Log structure, the orientation of the polysilicon rods 341 is rotated 90° between each structured layer 340, and between every other layer the rods 341 are shifted relative to each other by half of the pitch d. The structure 350 thereby has a face-centered-tetragonal lattice symmetry.

Figure 3F:
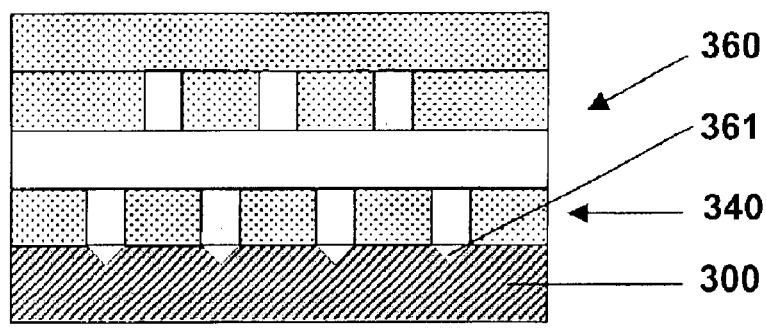

As shown in FIG. 3f, the polysilicon rods 341 can then be removed to form the lattice structure mold 360. The polysilicon rods 341 can be removed using a 6M, 85° C. KOH etch, which has a selectivity of ~100:1 (Si to $SiO_2$). Over-etch during the KOH process, which is desirable to ensure the removal of all the polysilicon 341, can result in the formation of a "V" structure 361 on the bottom of the layer 340 contacting the silicon substrate 300. This is due to etching of the underlying silicon substrate 300 and is dependent on the substrate crystallographic orientation. The KOH etch effectively stops when the etch-front encounters the slow etching (111) planes of the silicon substrate 300, thereby forming the "V" groove 361.

Figure 3G:
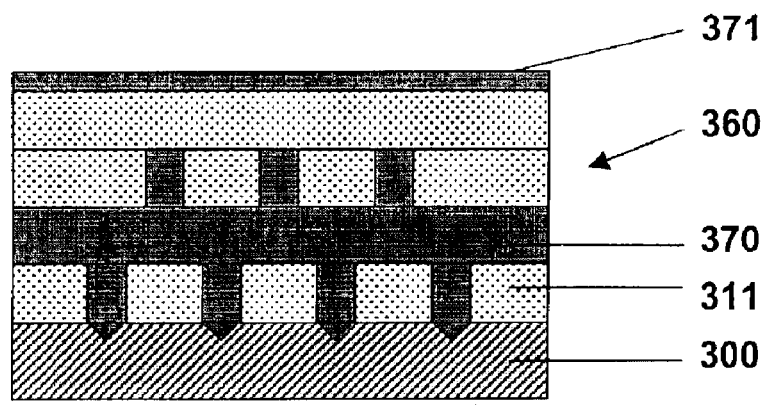

As shown in FIG. 3g, the lattice structure mold 360 can be backfilled with a structural material. A variety of deposition processes, such as chemical vapor deposition (CVD), electroplating, or infiltration with spin-on glasses or nanoparticles, can be used for the backfilling of the mold 360, so long as the sacrificial material (e.g., silica) can later be selectively removed from the backfilled structural material. For example, III-V compound semiconductors, II-VI materials, single and mixed oxides, nitrides, oxynitrides, metals, and metal alloys can be deposited by CVD. A precursor conducting coating can be applied to the lattice structure mold 360 and a wide variety of metals can be electroplated from a solution to backfill the mold 360. Typical electroplated metals include copper, nickel, gold, iron, silver, cobalt, and chromium.

The lattice structure mold 360 can be backfilled with tungsten via CVD to form tungsten rods 370 embedded in the silica mold material 311. A precursor 50 nm thick TiN adhesion layer (not shown) can be deposited on the mold 360 by reactive ion sputtering, since the blanket CVD tungsten film does not adhere to silicon dioxide. Tungsten can be deposited at high pressure (e.g., 90 Torr) from $WF_6$ and $H_2$. The chemical vapor deposition of tungsten results in films of very high purity. The tungsten film can have a resistivity of 10 µOhm-cm. Backfilling of the mold 360 with CVD tungsten 370 can result is a rough and uneven tungsten growth surface 371 on the top surface of the mold 360.

Figure 3H:
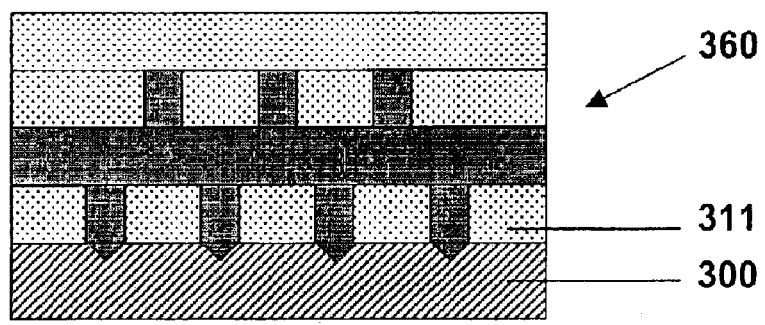
Figure 4A:
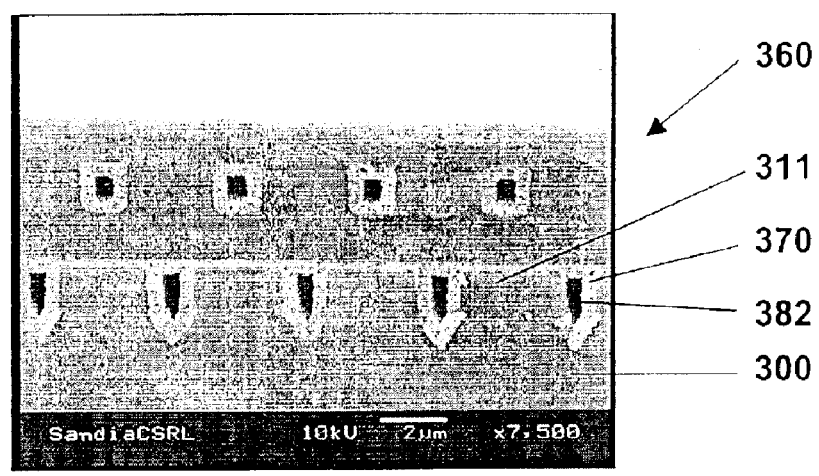
FIG. 4a shows the tungsten photonic crystal prior to removal of a silica sacrificial mold.

As shown in FIG. 3h the top surface of the backfilled mold 360 can planarized by CMP to remove the excess tungsten. A scanning electron micrograph of a tungsten-backfilled, planarized mold 360 is shown in FIG. 4a. As shown in FIG. 4a, a keyhole 382 can be formed in the center of the more deeply embedded lines of the tungsten rods 370, since the step coverage of the CVD tungsten deposition process is not 100%. However, the film thickness is far greater than the skin depth of tungsten for electromagnetic radiation in the visible and infrared.

Figure 3I:
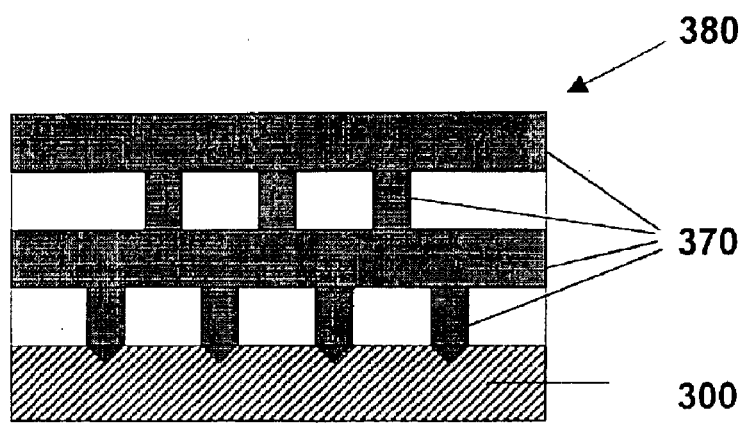
Figure 4B:
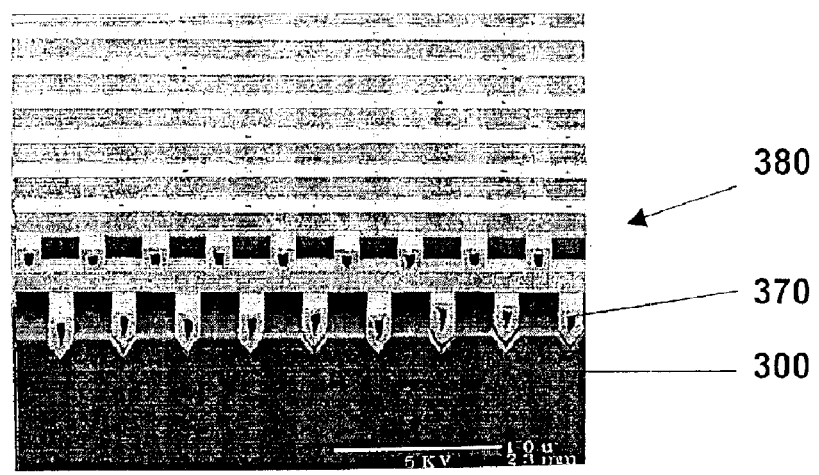
FIG. 4b shows the tungsten photonic crystal after removal of the silica sacrificial mold. The one-dimensional tungsten rod used to form the crystal has a rod width of 1.2 $\mu$m and the rod-to-rod spacing of 4.2 $\mu$m.

Finally, as shown in FIG. 3i, the silica spacer bars 311 can be removed from the tungsten-backfilled and planarized lattice structure mold 360 by selective etching with a 1:1 HF-based solution. The result is a 3D tungsten photonic crystal 380 comprising stacked tungsten rods 370 on the silicon substrate 300. FIG. 4b shows a scanning electron micrograph of the four-layer tungsten photonic crystal 380 comprising the stacked tungsten rods 370 on the silicon substrate 300. The tungsten photonic crystal 380 has a stacking sequence that repeats itself every four layers, and has a face-center-tetragonal lattice symmetry. The tungsten rod 370 width is 1.2 µm, rod-to-rod spacing is 4.2 µm and the filling fraction of the high index tungsten is 28%. The tungsten photonic crystal 380 retains sufficient structural integrity to be handled readily.

This fabrication process can be extended to create almost any interconnected photonic crystal having selective emissivity at visible or infrared wavelengths. For example, current state-of-the-art silicon integrated circuit processing tools are capable of shrinking the minimum feature sizes to those required for structures that have photonic bandgaps in the near infrared and have selective emissivity in the visible. See, e.g., "International Technology Roadmap for Semiconductors," 1999 Edition [retrieved on Aug. 9, 2001]. Retrieved from the Internet:<URL: http://public.itrs.net/files/1999_SIA_Road map/Home.htm>.

Optical Properties of the Tungsten Photonic Crystal

The optical properties of the 3D tungsten photonic crystal 380 fabricated according to the above process were characterized using a Fourier-transform infrared measurement system for wavelengths ranging from 1.5 to 25 $\mu$m. To obtain reflectance (R), a sample spectrum was taken from a 3D tungsten photonic crystal 380 first and then normalized to a reference spectrum of a uniform silver mirror. To find the absolute transmittance (T), a transmission spectrum taken from a tungsten photonic crystal 380 was normalized to that of a bare silicon wafer. This normalization procedure was to calibrate away extrinsic effects, such as light reflection at the air-silicon interface and absorption of the silicon substrate 300.

Figure 5:
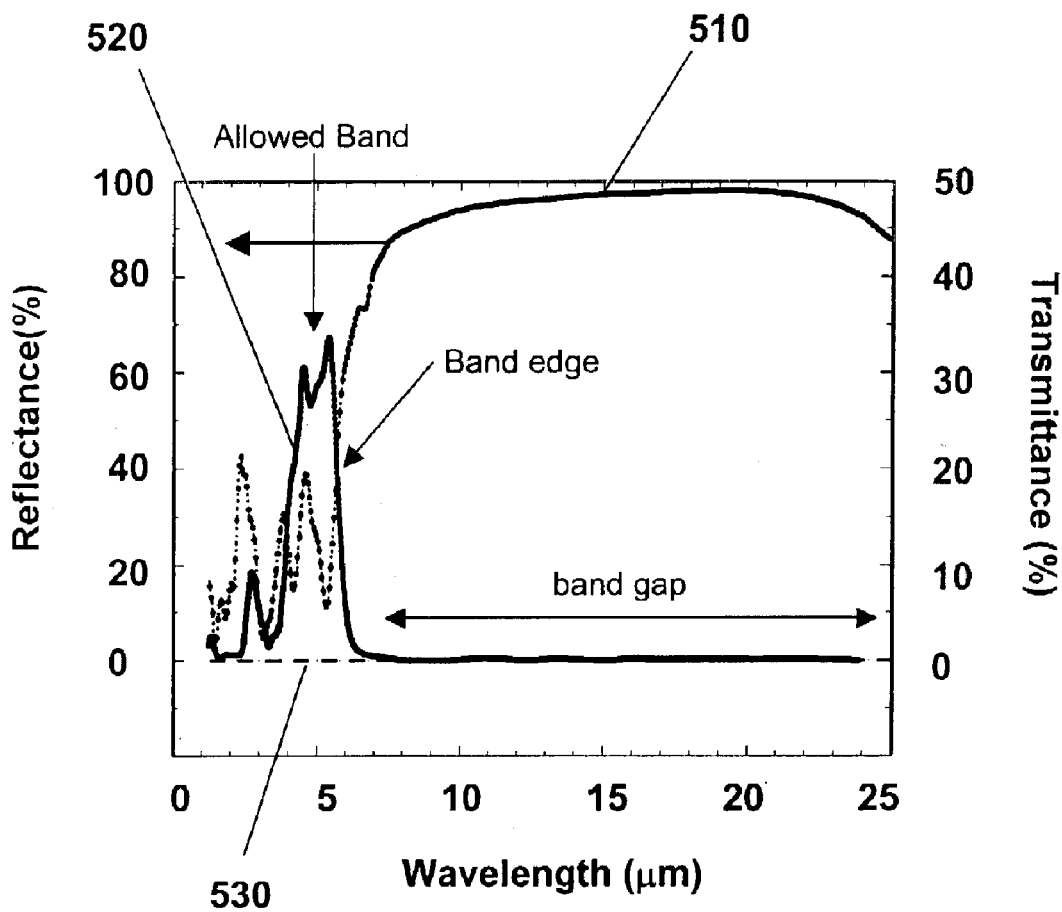
FIG. 5 shows the measured reflectance and transmittance spectra for the light propagating along the <001> axis of the four-layer tungsten photonic crystal.

FIG. 5 shows the absolute reflectance spectrum 510 and transmittance spectrum 520 of a four-layer tungsten photonic crystal 380. The dashed line 530 shows the transmittance of a 6000 Å uniform tungsten film for reference. Light propagates along the <001> direction of the tungsten photonic crystal 380 and is unpolarized. The reflectance 510 exhibits oscillations at $\lambda<5.5$ $\mu$m, raises sharply at $\lambda\sim6$ $\mu$m (the band edge) and finally reaches a high reflectance of 90% for $\lambda>8$ $\mu$m. Correspondingly, the transmittance 520 shows distinct peaks at $\lambda<5.5$ $\mu$m, decreases sharply at $\lambda\sim6$ $\mu$m (the band edge) and then vanishes to below 1% for $\lambda>8$ $\mu$m. The simultaneous high R and low T at wavelengths greater than 8 $\mu$m indicates the existence of a photonic band gap in the tungsten photonic crystal. The attenuation is $\sim30$ dB at $\lambda=10$ $\mu$m for the four-layer tungsten photonic crystal 380, or equivalently a 7.5 dB attenuation per layer. The multiple oscillations at $\lambda<5.5$ $\mu$m are attributed to photonic density-of-states oscillations in the photonic allowed band.

Figure 6:
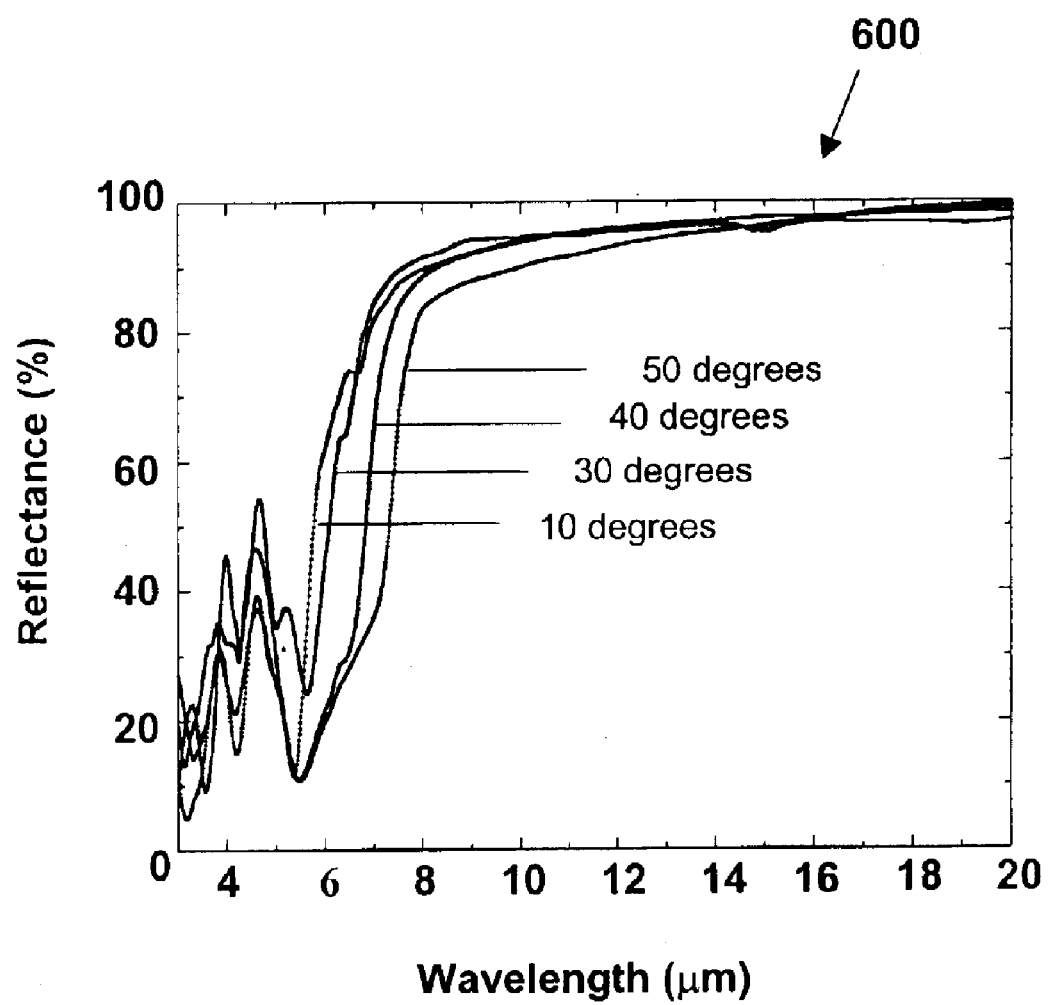
FIG. 6 shows the tilt-angle reflectance spectra from the four-layer tungsten photonic crystal.

As shown in FIG. 6, tilt-angle reflection spectra 600 were taken to determine the angular dependence of the photonic band gap. For tilt-angle transmission measurements, the tungsten photonic crystal 380 was mounted on a rotational stage and the rotational angles spanned from light incident angles from 0° to 60°, measured from the surface normal (i.e., the <001> direction). The crystal orientation is tilted from the <001> to <110> axes. The light incident angle is therefore systematically tilted away from G-X' toward G-L of the first Brillouin zone. Four tilt-angle spectra 600 are shown in FIG. 6, for light incident angles of 10, 30, 40, and 50°, respectively. As the light incident angle is increased, the band edge position moves from $\lambda\sim6$ $\mu$m for q=10° to $\lambda\sim8$ $\mu$m for q=50°. Both the oscillating features at $\lambda<6$ $\mu$m and the high reflectance at longer wavelength remain for all light incident angles. Therefore, a large complete 3D photonic band gap exists, from $\lambda\sim8$ $\mu$m to $\lambda>20$ $\mu$m, for the tungsten photonic crystal 380.

Figure 7:
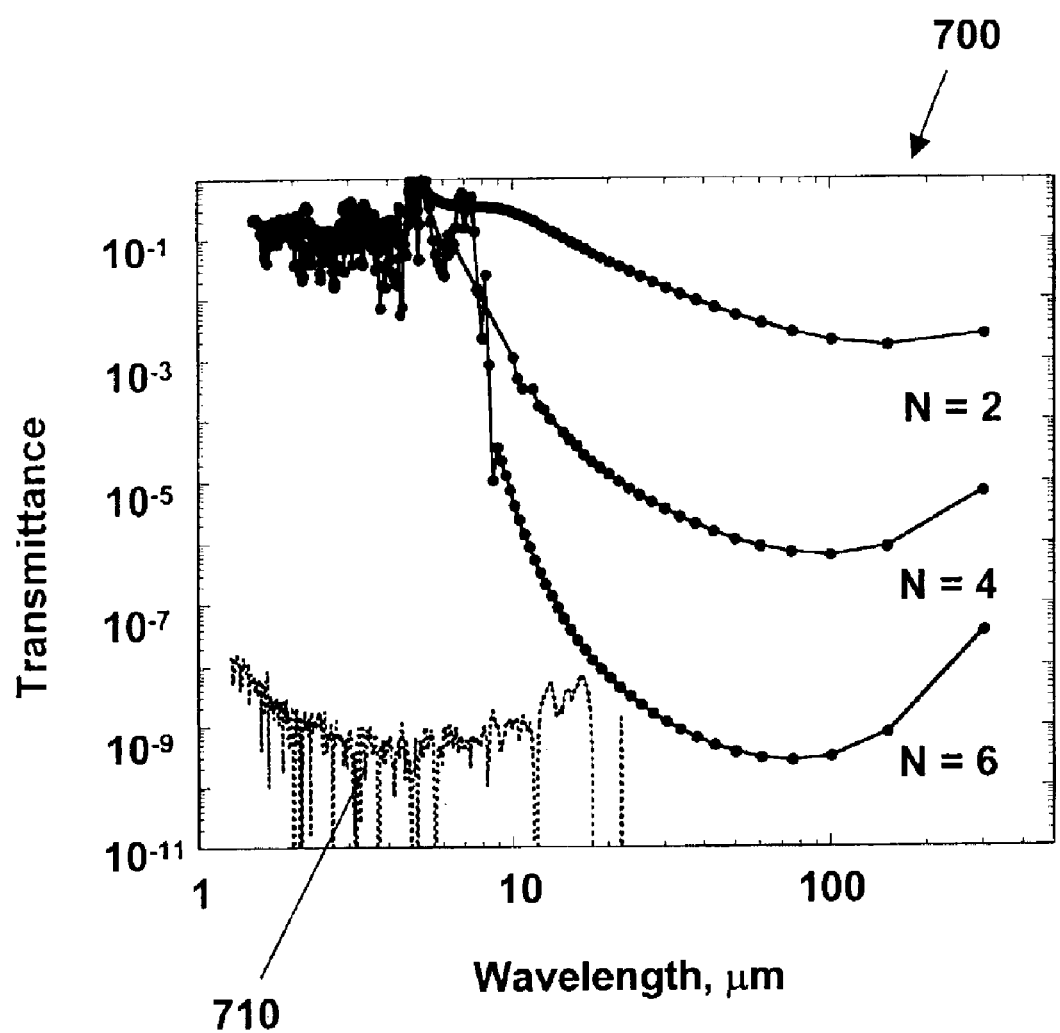
FIG. 7 shows the computed transmission spectra for tungsten photonic crystals with N=2, 4 and 6 layers.

FIG. 7 shows the theoretical transmission spectra 700 for tungsten photonic crystals of different number-of-layers, N=2, 4 and 6, plotted in a log-to-log scale. The dashed line 710 is a reference spectrum for a uniform 6000 Å tungsten film. The theoretical transmission spectra 700 were calculated according to the method of Sigalas et al. in Phys. Rev. B52, 11744 (1995). The transmittance 700 is very low in the bandgap (T<$10^{-8}$ for N=6 layers), which is consistent with the small metallic skin-depth (300–500 Å for 1 $\mu$m<$\lambda$<25 $\mu$m), and is nearly independent of wavelength. The crystal spectrum 700, on the other hand, exhibits a much higher transmission (T~$10^{-1}$) in the allowed band, suggesting that photonic transport in the metallic allowed band is not dominated by metallic attenuation. Moreover, a strong dependence on the number-of-layers of transmittance 700 is observed in the band gap ($\lambda>8$ $\mu$m). This number-of-layers-dependence indicates that transmittance attenuation at $\lambda>8$ $\mu$m scales with layer-thickness of the fabricated structure, but not the metallic skin depth. Hence, the observed low transmittance 700 is due primarily to the photonic band gap effect. The attenuation constant in the band gap is extraordinarily large—about 8, 14 and 16 dB per layer at $\lambda=10$, 20 and 40 $\mu$m, respectively. This suggests that as few as four to six crystal layers are sufficient for achieving strong electromagnetic wave attenuation.

Figure 8:
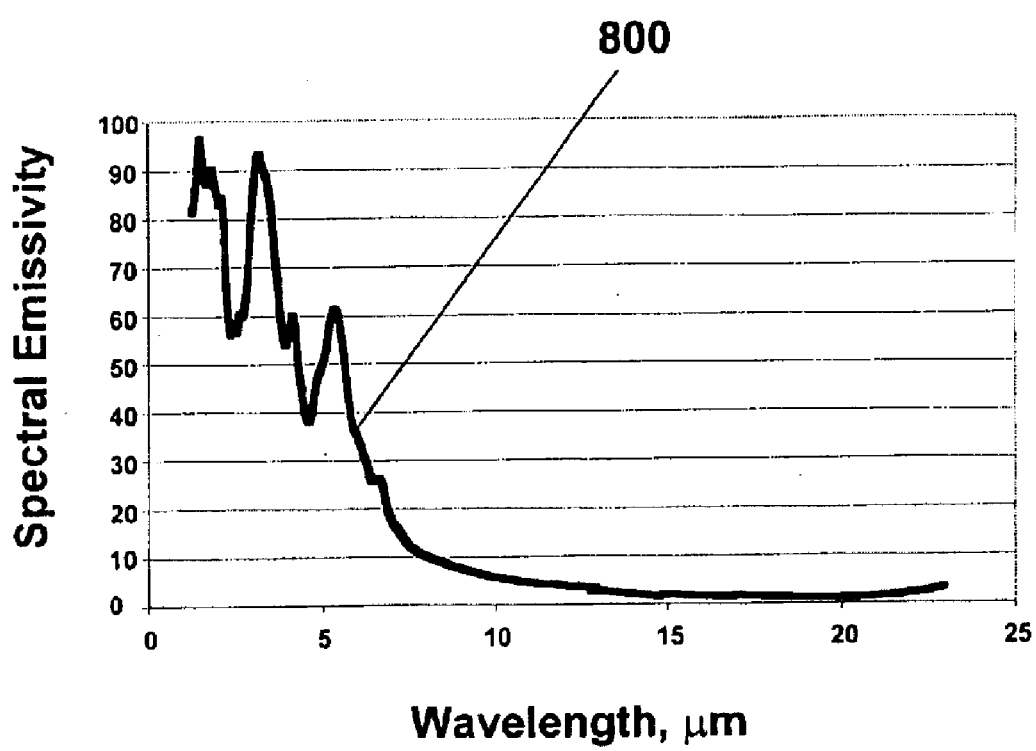
FIG. 8 shows the spectral emissivity of the four-layer tungsten photonic crystal having a lattice constant of 4.2 $\mu$m.

Such an extraordinarily large band gap is ideally suited for suppressing broadband Blackbody radiation in the infrared and re-cycling radiant energy into visible spectrum. FIG. 8 shows the spectral emissivity 800 of the tungsten photonic crystal 380. The crystal 380 has a photonic bandgap (region with nearly zero emissivity) over a large range in the far infrared (8 $\mu$m<$\lambda$<25 $\mu$m) portion of the spectrum. The very large photonic bandgap and large reduction in emissivity 800 in the far infrared is due to the use of metal for the photonic crystal. In the photon recycling process, the photonic band gap completely frustrates infrared thermal emission and selectively forces the radiation into near-infrared and visible emission. Consequently, energy is not wasted in heat generation, but rather re-channeled into a useful emission band. The lattice constant and refractory material of the photonic crystal can be determined by the fabrication process. Therefore, the emission band can be tailored to be in the visible when the photonic crystal is heated up to an elevated temperature of >1500° C., giving rise to a highly efficient incandescent lamp.

It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for fabricating a photonic crystal, comprising:
    a) forming a lattice structure mold of a sacrificial mold material on a substrate by sequentially depositing a cavity-filling material in a plurality of alternating patterned layers of the sacrificial mold material and removing the cavity-filling material to leave the lattice structure mold; and
    b) depositing a structural material into the lattice structure mold.

2. The method of claim 1, further comprising polishing the surface of the deposited structural material after step b).

3. The method of claim 2, wherein the polishing is chemical-mechanical polishing.

4. The method of claim 1, wherein the depositing step b) comprises chemical vapor deposition, electroplating, or nanoparticle infiltration.

5. The method of claim 1, wherein the sacrificial mold material comprises silica.

6. The method of claim 1, wherein the substrate comprises silicon.

7. The method of claim 1, wherein the cavity-filling material comprises polysilicon.

8. The method of claim 1, wherein the structural material is selected from the group of chemical vapor deposited materials consisting of III-V compound semiconductors, II-VI compound semiconductors, single and mixed oxides, nitrides, oxynitrides, metals, and metal alloys.

9. The method of claim 1, wherein the structural material comprises a refractory metal or non-metal.

10. The method of claim 9, wherein the refractory metal comprises tungsten or tungsten alloy.

11. The method of claim 1, wherein the structural material is selected from the group of electroplated metals consisting of copper, nickel, gold, iron, silver, cobalt, and chromium.

12. The method of claim 1, wherein each of the layers of the plurality of alternating patterned layers has a thickness of less than 10 microns.

13. The method of claim 1, wherein each of the layers of the plurality or alternating patterned layers has a thickness of less than 5 microns.

14. The method of claim 1, wherein each of the layers of the plurality of alternating patterned layers has a thickness of less than 1 micron.

15. The method of claim 1, wherein the photonic crystal comprises a Lincoln-Log type structure.

16. The method of claim 1, further comprising removing the sacrificial mold material from the lattice structure mold after step b).

17. The method of claim 1, wherein the forming step a) comprises:
   a) depositing a layer of the sacrificial mold material on the substrate,
   b) patterning the layer of the sacrificial mold material to form a plurality of cavities in the layer of sacrificial mold material,
   c) depositing the cavity-filling material in the plurality of cavities,
   d) depositing another layer of the sacrificial mold material on the filled patterned layer of the sacrificial mold material;
   e) repeating steps b) through d) at least once,
   f) patterning the last layer of sacrificial mold material from step d), and
   g) removing the cavity-filling material to leave the lattice structure mold.

18. The method of claim 17, wherein the patterning step b) comprises photolithographic exposure of the layer of sacrificial mold material through an etch mask, anisotropic etching of the exposed regions of the layer, and stripping of the etch mask.

19. The method of claim 17, further comprising polishing the surface of the filled patterned layer of the sacrificial mold material after step c).

20. The method of claim 19, when the polishing comprises chemical-mechanical polishing.

* * * * *